United States Patent
Park

(10) Patent No.: US 9,362,419 B2
(45) Date of Patent: Jun. 7, 2016

(54) VARIABLE RESISTANCE DEVICE HAVING PARALLEL STRUCTURE

(71) Applicant: SK hynix Inc., Icheon (KR)

(72) Inventor: Hyung Jin Park, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/057,919

(22) Filed: Oct. 18, 2013

(65) Prior Publication Data
US 2014/0327085 A1    Nov. 6, 2014

(30) Foreign Application Priority Data
May 6, 2013    (KR) .................. 10-2013-0050526

(51) Int. Cl.
*H01L 29/8605*    (2006.01)
*H01L 29/66*    (2006.01)
*H01L 49/02*    (2006.01)

(52) U.S. Cl.
CPC ...... *H01L 29/8605* (2013.01); *H01L 29/66166* (2013.01); *H01L 28/20* (2013.01)

(58) Field of Classification Search
CPC ... H01C 7/10; H01L 28/20; H01L 2924/1207
USPC .......... 257/288, 379, 380, 401, 516, E21.004
See application file for complete search history.

(56) References Cited

U.S. PATENT DOCUMENTS

| | | | | |
|---|---|---|---|---|
| 6,277,722 | B1* | 8/2001 | Lee et al. ....................... | 438/592 |
| 6,291,330 | B1* | 9/2001 | Sze ................... | H01L 29/66583 |
| | | | | 257/E21.199 |
| 6,674,116 | B1* | 1/2004 | Cao ............................... | 257/312 |
| 6,720,621 | B1* | 4/2004 | Adan ............................ | 257/350 |
| 2001/0024870 | A1* | 9/2001 | Tanabe et al. ................. | 438/592 |
| 2006/0152086 | A1* | 7/2006 | Venezia et al. ................ | 307/112 |
| 2006/0270073 | A1* | 11/2006 | Isobe ............................. | 438/17 |
| 2008/0272442 | A1* | 11/2008 | Venugopal et al. ........... | 257/402 |
| 2009/0057782 | A1* | 3/2009 | Ahn ............................... | 257/401 |
| 2012/0056258 | A1* | 3/2012 | Chen ............................. | 257/316 |
| 2013/0001704 | A1* | 1/2013 | Wang et al. ................... | 257/379 |

* cited by examiner

*Primary Examiner* — David Vu

(57) ABSTRACT

A variable resistance device includes a parallel structure. The variable resistance device is formed using a silicon (Si) substrate. In the variable resistance device, a conductive line arranged in a current direction is formed over an impurity region, and a resistance value of the resistance device is precisely adjusted by adjusting a level of a voltage applied to the conductive line. The variable resistance device includes a first impurity region formed in a substrate, a second impurity region formed in the substrate and arranged parallel to the first impurity region, a conductive line formed over the first impurity region, and electrode terminals formed at both longitudinal ends of the second impurity region to be coupled to the second impurity region.

18 Claims, 7 Drawing Sheets

VARIABLE RESISTANCE DEVICE HAVING PARALLEL STRUCTURE

CROSS-REFERENCE TO RELATED APPLICATION

The priority of Korean patent application No. 10-2013-0050526 filed on 6 May 2013, the disclosure of which is hereby incorporated by reference in its entirety, is claimed.

BACKGROUND

Embodiments of the present invention relate to a resistance device of a semiconductor device, and more particularly to a variable resistance device in which conductive lines are arranged parallel to the direction of a current over an impurity region.

Typically, a variable resistor for use in an integrated circuit (IC) is formed using a MOS transistor structure. In the MOS transistor structure, a voltage (Vc) is applied to a gate electrode of a MOS transistor formed over a P-type semiconductor substrate, and a voltage (Vi) and a voltage (Vo) are respectively applied to a diffusion layer serving as a source region of the MOS transistor and a diffusion layer serving as a drain region of the MOS transistor. The gate voltage (Vc) is changed as denoted by (Vo−Vi)<<(Vc−Vth) to adjust a resistance value of a channel between the source region and the drain region, (Vth) being a threshold voltage of the MOS transistor. That is, a gate is formed to cross a current direction (source⇌drain), and the gate voltage (Vc) is changed such that the channel resistance value between the source region and the drain region is changed.

However, a resistance value obtained using the channel of the MOS transistor is affected by a defect on a surface of a variable resistive element determined by the channel, and the size of the variable resistive element is decided by physical characteristics of the material forming the variable resistive element or by a circuit design. Therefore, to adjust the size of the variable resistive element by a desired degree, the circuit design or the concentration of a diffusion material used for the diffusion layer should be adjusted.

In addition, in a curve showing the relationship between a current flowing through the channel and a voltage (Vo−Vi) applied to the diffusion layers, the range of voltage having a linear portion is small. Thus, when the channel of the MOS transistor is used as the variable resistive element, a variable resistance range of the variable resistive element is unavoidably limited.

SUMMARY

Embodiments of the present invention are directed to providing a variable resistance device having a parallel structure to address issues of the related art.

An embodiment of the present invention relates to a variable resistance device in which a structure of a resistive element allows a resistance value of the resistive device to be precisely adjusted.

In accordance with an aspect of the embodiment, a variable resistance device includes: a first impurity region formed in a substrate and having a line type; a second impurity region formed in the substrate and arranged parallel to the first impurity region; a conductive line formed over the first impurity region; and electrode terminals formed at both longitudinal ends of the second impurity region, the electrode terminals being coupled to the second impurity region.

The first impurity region and the second impurity region may include the same type of impurities. If necessary, the first impurity region and the second impurity region may have a different impurity concentration from each other.

The first impurity region may have a lower impurity concentration than the second impurity region.

The second impurity region may be symmetrically located at both sides of the conductive line. In this case, each of the electrode terminals is commonly coupled to the second impurity region located at both sides of the conductive line.

The conductive line may include: an insulation film; a polysilicon layer formed over the insulation film, and doped with the same type of impurity as that of the first impurity region; a metal layer formed over the polysilicon layer; and a hard mask formed over the metal layer.

In accordance with another aspect of the embodiment, a variable resistance device includes: a plurality of first impurity regions formed in a substrate and having a line type; a plurality of second impurity regions formed in the substrate and alternately arranged with the first impurity regions; a plurality of conductive lines each formed over a corresponding one of the first impurity regions; and electrode terminals formed at both longitudinal ends of the second impurity regions, the electrode terminals being coupled to the second impurity regions.

The conductive lines are configured to receive the same control voltage, or may receive different-sized control voltages.

It is to be understood that both the foregoing general description and the following detailed description of embodiments are exemplary and explanatory and are intended to provide further explanation of the invention as claimed.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

Figure 1:
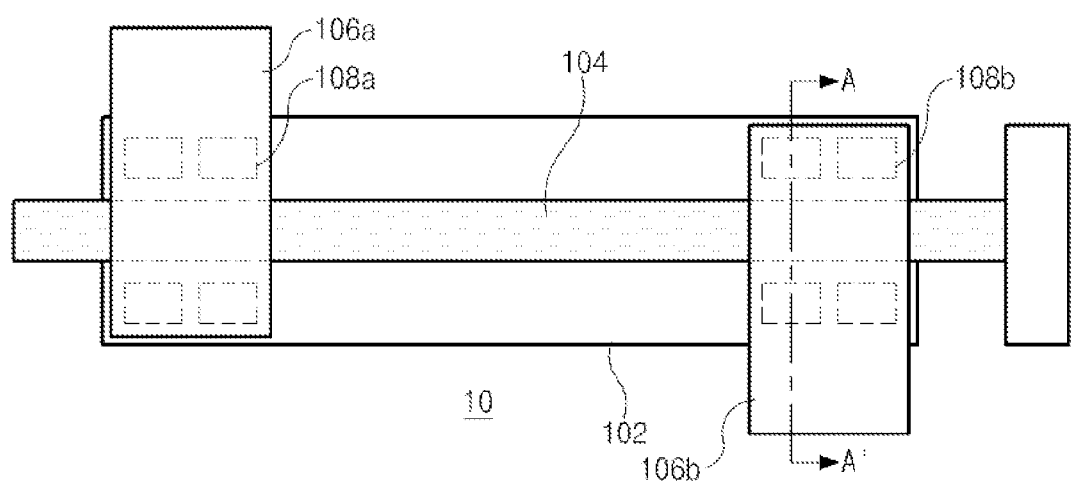
FIG. 1 is a plan view illustrating a resistance device according to an embodiment of the present invention.
Figure 2:
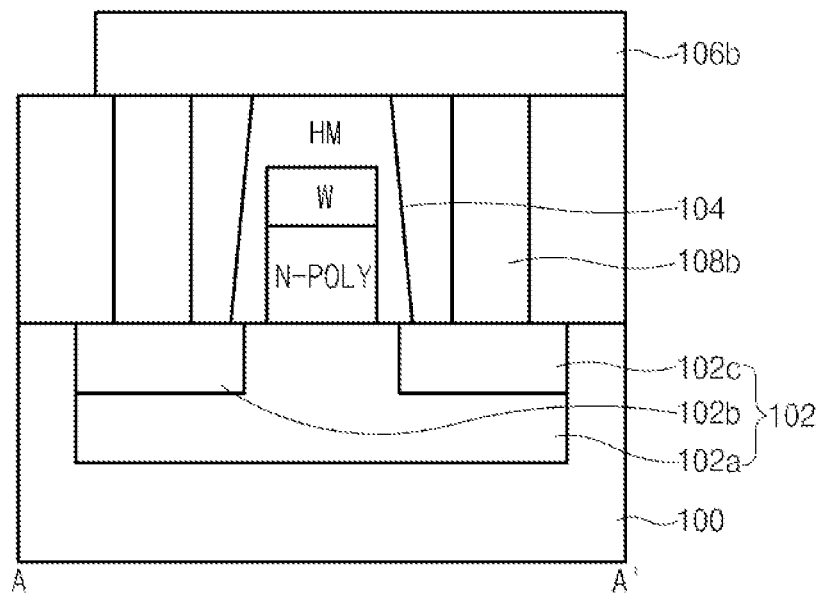
FIG. 2 is a cross-sectional view illustrating the resistance device taken along a line A-A' of FIG. 1.

FIG. 1 is a plan view illustrating a resistance device 10 according to an embodiment of the present invention. FIG. 2 is a cross-sectional view illustrating the resistance device 10 taken along a line A-A' of FIG. 1.

Referring to FIGS. 1 and 2, the resistance device 10 includes an impurity region 102 that is formed in a semiconductor substrate 100, and a conductive line 104 that is formed as a line type. Thus, the conductive line 104 is formed along a line extending in a longitudinal direction in FIG. 1, i.e., a current direction of the resistance device 10. The conductive line 104 is formed over the impurity region 102.

The impurity region 102 may include an N-type impurity such as phosphorus (P) or arsenic (As). The impurity region 102 includes a first impurity region 102a, over which the conductive line 104 is formed and second and third impurity regions 102b and 102c, disposed at both sides of the conductive line 104 and separated by the first impurity region 102a. The first to third impurity regions 102a, 102b, and 102c are arranged parallel to one another and extend along the direction of the current.

In an embodiment, the conductive line 104 includes a stacked structure of an N-type polysilicon (N-poly) layer doped with a material having the same impurity type as that of the impurity region 102, a metal (W) layer, and a hard mask (HM) layer. In an embodiment, an insulation film (not shown) having a thickness of about 57 Å is formed between the impurity region 102 and the conductive line 104. The insulation film may include an oxide film. A terminal for receiving a control voltage from an external part is coupled to one longitudinal end of the conductive line 104 through a contact (not shown), such that a resistance value of the resistance device can be adjusted.

A first electrode terminal (e.g., anode) 106a and a second electrode terminal (e.g., cathode) 106b for coupling the resistance device 10 to other devices are formed over both longitudinal ends of the impurity region 102 extending in the current direction. That is, the anode 106a and the cathode 106b are formed over both longitudinal ends of the resistance device 10 such that the resistance device 10 can be coupled to other devices through the anode 106a and the cathode 106b. The first electrode terminal (anode) 106a is commonly coupled to the second and third impurity regions 102b and 102c disposed at both sides of the conductive line 104 through an electrode contact 108a at one longitudinal end of the impurity region 102, and the second electrode terminal (cathode) 106b is commonly coupled to the second and third impurity regions 102b and 102c through a contact 108b at the other longitudinal end of the impurity region 102.

In the impurity region 102, the first impurity region 102a over which the conductive line 104 is formed has an impurity concentration that is different from those of the second and third impurity regions 102b and 102c. In an embodiment, the impurity concentration of the second and third impurity regions 102b and 102c is higher than the impurity concentration of the first impurity region 102a. Accordingly, the resistance value of the resistance device 10 is obtained based on a resistance value of the first impurity region 102a and resistance values of the second and third impurity regions 102b and 102c.

In accordance with an embodiment, a level of a voltage applied to the conductive line 104 is adjusted to change the resistance value of the first impurity region 102a, such that the resistance value of the resistance device 10 can be adjusted. That is, the resistance values of the second and third impurity regions 102b and 102c of the impurity region 102 are kept constant, and the resistance value of the first impurity region 102a, which is coupled and parallel to the second and third impurity regions 102b and 102c, is changed by the voltage applied to the conductive line 104. As a result, the resistance value of the resistance device 10 is adjusted.

Figure 3:
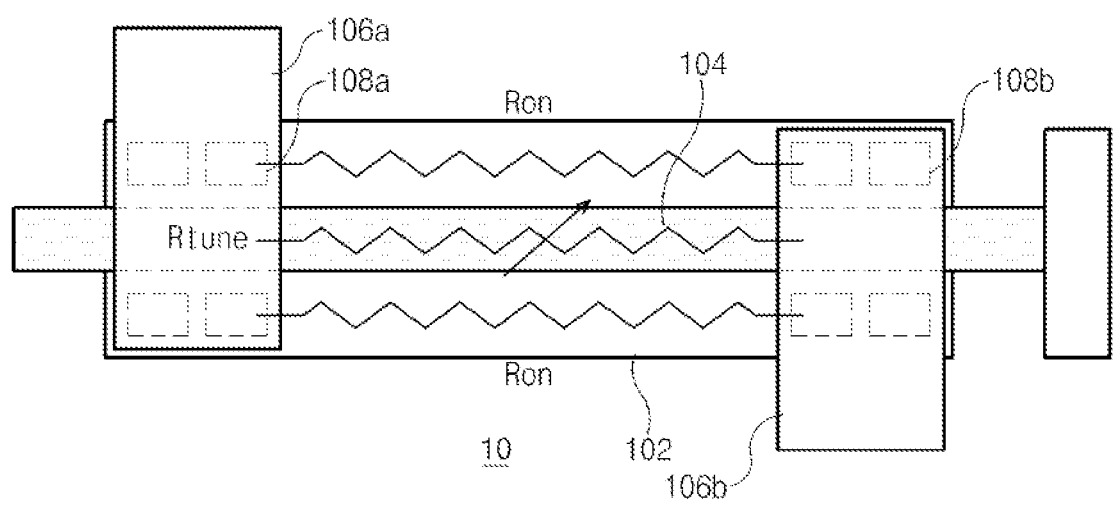
FIG. 3 is a schematic diagram illustrating a resistor formed in the resistance device of FIG. 1.

FIG. 3 is a schematic diagram illustrating a resistor formed in the resistance device 10 of FIG. 1. Embodiments in which the resistance value of the resistance device 10 is changed will hereinafter be described with reference to FIG. 3.

Referring to FIG. 3, the resistance value of the first impurity region 102a is denoted by 'Rtune', and the resistance value of the second and third impurity regions 102b and 102c is denoted by 'Ron.' The first impurity region 102a and the second and third impurity regions 102b and 102c are parallel and connected to each other. Thus, the resistance value Rtotal of the resistance device 10 is achieved by parallel connection of Rtune and Ron. In this case, the resistance value Rtotal may be represented by the following formula 1.

$$R\text{total} = R\text{on} \times R\text{tune}/(R\text{on} + R\text{tune})$$ [Formula 1]

When a voltage of 0V is applied to the conductive line 104 (Case 1, Vg=0V), because the impurity concentration of the second and third impurity regions 102b and 102c is higher than the impurity concentration of the first impurity region 102a, i.e., the resistance value Rtune of the first impurity region 102a is higher than the resistance value Ron of the second and third impurity regions 102b and 102c, a current flowing through the second and third impurity regions 102b and 102c becomes higher than a current flowing through the first impurity region 102a disposed below the conductive line 104.

Meanwhile, when a higher voltage Vpp of 3.2V is applied to the conductive line 104 (Case 2, Vg=3.2V), majority carriers (electrons) are collected at a surface of the first impurity region 102a below the conductive line 104, such that a path of the majority carriers is formed in the first impurity region 102a. Because of the carrier path, the resistance value Rtune becomes much lower than the resistance value Ron as denoted by (Rtune<Ron), such that a high current flows through the first impurity region 102a. That is, the resistance value Rtotal of the resistance device 10 in Case 2 becomes much lower than that in Case 1.

However, when a negative voltage Vbbw, e.g., −0.2V, is applied to the conductive line 104 (Case 3, Vg=−0.2V), the resistance value Rtune becomes much higher than the resistance value Ron, and is denoted by (Rtune>Ron). This effect is opposite to that of Case 2. As a result, in Case 3, the resistance value Rtotal of the resistance device 10 becomes much higher than that in Case 1.

Although the above-mentioned examples describe the voltage (control voltage) applied to the conductive line 104 as having three specific voltage values 0V, 3.2V, and −0.2V for convenience of description, the invention is not limited thereto. One of skill in the art will understand that other voltage levels may be applied in accordance with embodiments of the present invention. As described above, a level of the control voltage can be changed with precision to precisely adjust the resistance value of the resistance device 10. While a resistance value of an entire path along which current flows is adjusted in the related art, a resistance value of a part of the entire path can be adjusted in an embodiment of the present invention. That is, according to an embodiment, since the relationship between a resistance value of one path, along which the resistance value is changed, and a resistance value of the other path, along which the resistance value is kept constant, is characterized by parallel connection, the resistance value of the resistance device 10 does not change according to a quadratic function, but changes linearly. As a result, the resistance value of the resistance device 10 can be more precisely adjusted.

Figure 4A:
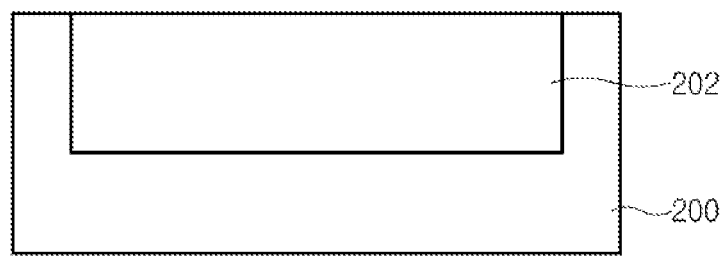
FIGS. 4A to 4C are cross-sectional views illustrating a method for forming a resistance device according to an embodiment of the present invention.
Figure 4B:
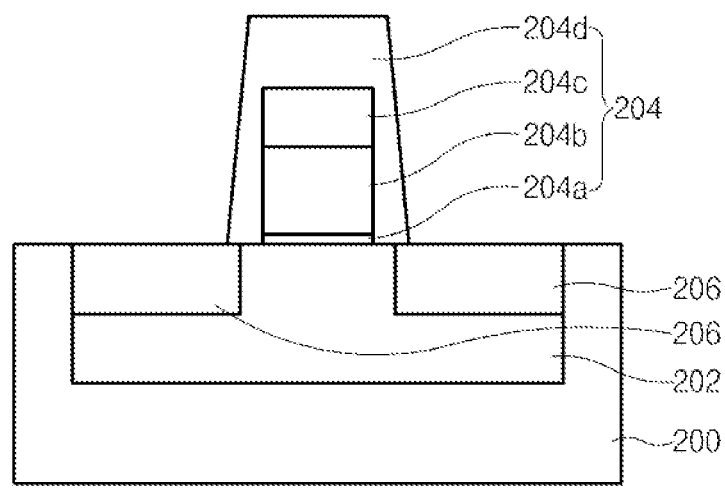
Figure 4C:
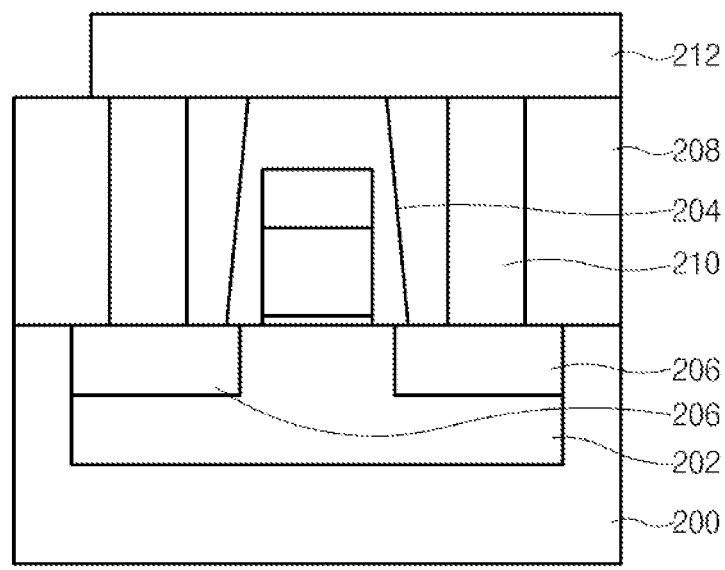

FIGS. 4A to 4C are cross-sectional views illustrating a method for forming the resistance device 10 of FIGS. 1 and 2.

Referring to FIG. 4A, an N-type impurity is implanted into a specific region in which the resistance device 10 is to be formed in a P-type semiconductor substrate 200, so that an impurity region (N-well) 202 is formed. The N-type impurity may include phosphorus (P) or arsenic (As).

Referring to FIG. 4B, after an insulation film 204a, a polysilicon film 204b, and a metal film 204c are sequentially formed over a center portion of the impurity region 202 as a line type extending along a current direction of the resistance device 10 in the same manner as the conductive line 104 of FIG. 1. The insulation film 204a may include an oxide film, and the polysilicon film 204b may be formed of the same N-type impurity polysilicon material as a material used to form the impurity region 202. The metal film 204c may include tungsten (W). Subsequently, a hard mask layer is formed to cover the insulation film 204a, the polysilicon film 204b, and the metal film 204c, and is then patterned, such that a hard mask 204d is formed to cover the insulation film 204a, the polysilicon film 204b, and the metal film 204c. As a result, a conductive line 204 is formed over the impurity region 202, the conductive line 204 including the insulation film 204a, the polysilicon film 204b, the metal film 204c, and the hard mask 204d.

Thereafter, an N-type impurity is implanted into the impurity region 202 at both sides of the conductive line 204 using the conductive line 204 as a mask. In more detail, the N-type impurity is implanted into two side portions 206 of the impurity region 202 over which the conductive line 204 is not formed, such that the impurity concentration of the two side portions 206 becomes higher than that of the rest of the impurity region 202.

Referring to FIG. 4C, after an interlayer insulation film 208 is formed over the two side portions 206 and the conductive line 204, contact holes (not shown) are formed to expose the two side portions 206. Subsequently, a conductive material is formed to fill the contact holes and is then planarized until the interlayer insulation film 208 is exposed, so that electrode contacts 210 are formed between the interlayer insulation film 208.

Subsequently, a conductive film is formed over the electrode contacts 210 and the interlayer insulation film 208, and is then patterned. As a result, an electrode terminal 212 for interconnecting the electrode contacts 210 is formed.

Figure 5A:
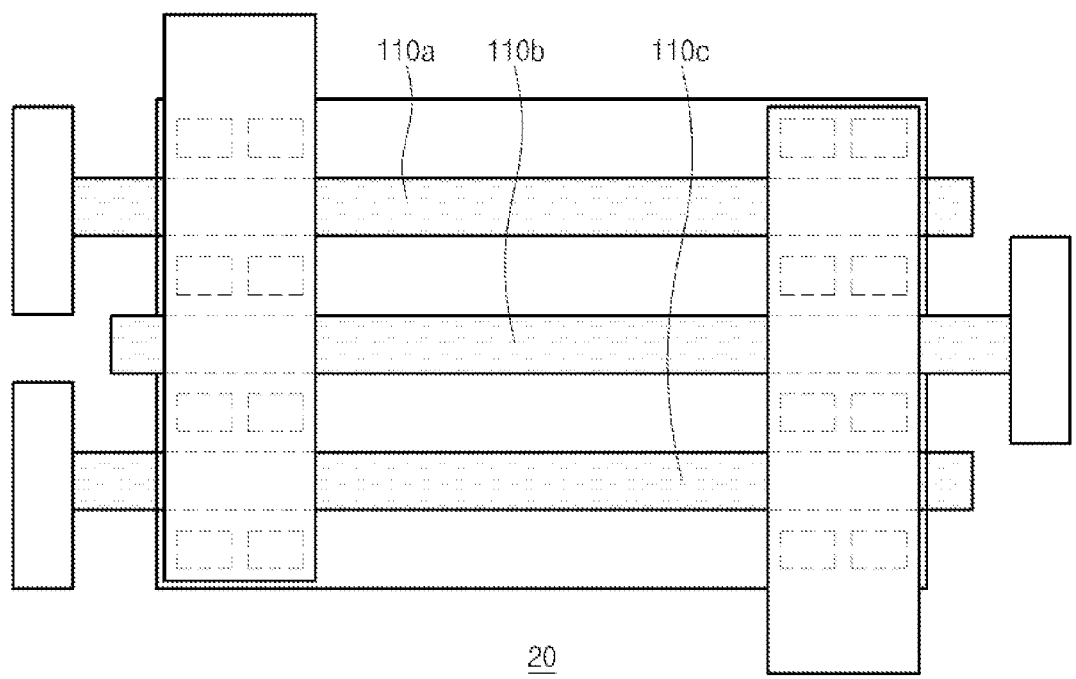
FIGS. 5A and 5B are plan views each illustrating a resistance device according to another embodiment of the present invention.
Figure 5B:
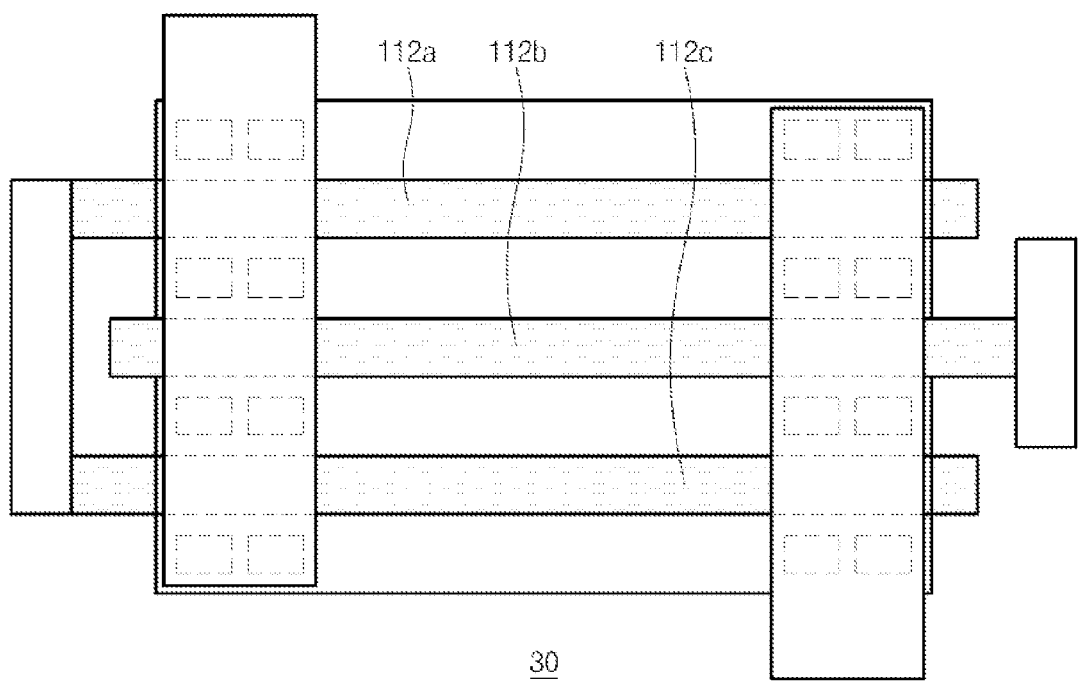

FIGS. 5A and 5B are plan views each illustrating a resistance device 20 and 30, respectively, according to another embodiment of the present invention. As can be seen from FIGS. 5A and 5B, multiple conductive lines 110a to 110c and 112a to 112c are formed over an impurity region and are arranged parallel to one another.

In FIG. 5A, control voltages are independently applied to conductive lines 110a to 110c that are arranged parallel to each other. The conductive lines 110a to 110c are spatially separate from each other. The control voltages applied to the respective conductive lines 110a to 110c may have the same or different voltage levels, such that a resistance value of the resistance device 20 can be precisely adjusted in response to the control voltages. Since the relationship between a resistance value of one portion of the impurity region, over which a conductive line is formed, and a resistance value of the other portion of the impurity region, over which no conductive line is formed, is characterized by parallel connection as described above, resistance values of parallel-connected resistors are adjusted in various ways. The parallel-connected resistors correspond to a plurality of portions of the impurity region, which is divided by the conductive lines 110a to 110c. As a result of the parallel connection of these portions, the resistance value of the resistance device 20 can be precisely adjusted.

In FIG. 5B, some of the conductive lines 112a to 112c are coupled to each other, and thus the same control voltages are simultaneously applied to the coupled conductive lines 112a and 112c. Only three conductive lines 112a to 112c are shown in FIG. 5B, and two conductive lines 112a and 112c are coupled to each other. However, the number of coupled conductive lines may increase as the number of parallel conductive lines increases. In addition, conductive lines to be coupled to each other may be arbitrarily decided by a designer as necessary.

Multiple electrode contacts coupled to an electrode terminal are formed at both longitudinal ends of the impurity region over which no conductive line is formed.

In the above-mentioned embodiments, the impurity concentration of a first impurity region over which the conductive line is formed is different from the impurity concentration of a second impurity region over which no conductive line is formed. However, in another embodiment, the first and second impurity regions may have the same impurity concentration. In this case, assuming that a control voltage of 0V is applied to the conductive line, the first and second impurity regions operate as a single impurity region. In contrast, assuming that another control voltage different from 0V is applied to the conductive line, a resistor of the first impurity region may be coupled and parallel to a resistor of the second impurity region.

As is apparent from the above description, a resistance value of a resistance device can be precisely adjusted by including a parallel structure according to embodiments of the present invention.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a volatile memory device or nonvolatile memory device. Other additions, subtractions, or modifications are obvious in view of the present disclosure and are intended to fall within the scope of the appended claims.

What is claimed is:

1. A variable resistance device comprising:
a first impurity region disposed in a substrate and having a line type;
a second impurity region disposed in the substrate and arranged parallel to and in contact with the first impurity region;
a conductive line disposed over the first impurity region;
a first electrode terminal coupled to one end of the second impurity region in a longitudinal direction; and
a second electrode terminal coupled to the other end of the second impurity region in the longitudinal direction,
wherein the first impurity region and the second impurity region include the same type of impurities, and wherein the whole first impurity region is formed with a same impurity.

2. The variable resistance device according to claim 1, wherein the first impurity region and the second impurity region have different impurity concentrations from each other.

3. The variable resistance device according to claim 2, wherein the first impurity region has a lower impurity concentration than the second impurity region.

4. The variable resistance device according to claim 1, wherein the first impurity region and the second impurity region have the same impurity concentration.

5. The variable resistance device according to claim 1, wherein the first impurity region and the second impurity region include N-type impurities.

6. The variable resistance device according to claim 1, further comprising a third impurity region disposed in the substrate and at a side of the conductive line opposite to the second impurity region.

7. The variable resistance device according to claim 6, wherein the second and third impurity regions are symmetrically disposed at both sides of the conductive line.

8. The variable resistance device according to claim 6, wherein the first electrode terminal is further coupled to one end of the third impurity region and the second electrode terminal is further coupled to the other end of the third impurity region.

9. The variable resistance device according to claim 1, wherein the conductive line includes:
  an insulation film;
  a polysilicon layer disposed over the insulation film, and doped with the same type of impurity as that of the first impurity region;
  a metal layer disposed over the polysilicon layer; and
  a hard mask disposed over the metal layer.

10. A variable resistance device comprising:
  a plurality of first impurity regions disposed in a substrate and having a line type;
  a plurality of second impurity regions disposed in the substrate and alternately arranged with the first impurity regions;
  a plurality of conductive lines each disposed over a corresponding one of the first impurity regions;
  a first electrode terminal commonly coupled to one ends of the plurality of second impurity regions in a longitudinal direction; and
  a second electrode terminal commonly coupled to the other ends of the plurality of second impurity regions in the longitudinal direction,
  wherein the first impurity regions and the second impurity regions include the same type of impurity, and
  wherein the whole first impurity region is formed with a same impurity.

11. The variable resistance device according to claim 10, wherein the conductive lines are configured to receive the same control voltage.

12. The variable resistance device according to claim 10, wherein the conductive lines are configured to be independently controlled by different control voltages.

13. The variable resistance device according to claim 10, wherein the first impurity regions have a different impurity concentration than the second impurity regions.

14. The variable resistance device according to claim 10, wherein the second impurity regions are located at both sides of the conductive lines.

15. The variable resistance device according to claim 10, wherein a conductive line includes:
  an insulation film;
  a polysilicon layer disposed over the insulation film, and doped with the same type of impurity as that of a first impurity region;
  a metal layer disposed over the polysilicon layer; and
  a hard mask disposed over the metal layer.

16. The variable resistance device according to claim 10, wherein at least two of the conductive lines are connected to each other.

17. A variable resistance device comprising:
  a first resistive element disposed in a substrate;
  a second resistive element disposed in the substrate and arranged parallel to and in contact with the first resistive element; and
  a conductive line disposed over the first resistive element,
  wherein the first resistive element and the second resistive element include the same type of impurity, and
  wherein the whole first resistive element is formed with a same impurity.

18. The variable resistance device according to claim 17, wherein a resistance value of the first resistive element is changed by a voltage applied to the conductive line.

* * * * *